United States Patent
Nakano et al.

(10) Patent No.: US 9,409,247 B2
(45) Date of Patent: Aug. 9, 2016

(54) JOINING METHOD, METHOD FOR PRODUCING ELECTRONIC DEVICE AND ELECTRONIC PART

(71) Applicant: MURATA MANUFACTURING CO., LTD., Nagaokakyo-shi, Kyoto-Fu (JP)

(72) Inventors: Kosuke Nakano, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 111 days.

(21) Appl. No.: 14/460,519

(22) Filed: Aug. 15, 2014

(65) Prior Publication Data

US 2014/0345939 A1 Nov. 27, 2014

Related U.S. Application Data

(63) Continuation of application No. PCT/JP2013/053026, filed on Feb. 8, 2013.

(30) Foreign Application Priority Data

Mar. 5, 2012 (JP) ................. 2012-048025

(51) Int. Cl.
B23K 31/02 (2006.01)
B23K 1/00 (2006.01)
(Continued)

(52) U.S. Cl.
CPC .............. *B23K 1/0016* (2013.01); *B23K 1/008* (2013.01); *B23K 1/19* (2013.01); *B23K 35/025* (2013.01); *B23K 35/0216* (2013.01); *B23K 35/0233* (2013.01); *B23K 35/0244* (2013.01); *B23K 35/0266* (2013.01); *B23K 35/222* (2013.01); *B23K 35/26* (2013.01); *B23K 35/262* (2013.01); *B23K 35/302* (2013.01); *C22C 9/00* (2013.01); *C22C 9/01* (2013.01); *C22C 9/04* (2013.01);
(Continued)

(58) Field of Classification Search
None
See application file for complete search history.

(56) References Cited

U.S. PATENT DOCUMENTS 2,571,864 A * 10/1951 Graybill ............... H01H 33/123
200/554
4,010,965 A * 3/1977 Izuma ................. B23K 20/085
228/107
(Continued)

FOREIGN PATENT DOCUMENTS

DE 19750586 A1 * 5/1999 ........... B23K 1/0056
GB 1452805 A * 10/1976 .............. H01L 29/00
(Continued)

OTHER PUBLICATIONS

PCT/JP2013/053026 Written Opinion dated May 7, 2013.

*Primary Examiner* — Kiley Stoner
(74) *Attorney, Agent, or Firm* — Arent Fox LLP (57) ABSTRACT

In joining a first metal member composed of a first metal to a second metal member composed of a second metal with a joining material interposed therebetween, the joining material including a low melting point metal having a lower melting point than the first metal and/or the second metal, the low melting point metal composing the joining material is Sn or an alloy containing Sn, at least one of the first metal and the second metal is a metal or an alloy which forms an intermetallic compound with the low melting point metal composing the joining material, and heat treatment is performed at a temperature at which the low melting point metal melts in a state of locating the joining material between the first metal member and the second metal member.

5 Claims, 2 Drawing Sheets (51) Int. Cl.
  *B23K 1/19*    (2006.01)
  *B23K 35/26*   (2006.01)
  *C22C 9/00*    (2006.01)
  *C22C 9/01*    (2006.01)
  *C22C 13/00*   (2006.01)
  *C22C 13/02*   (2006.01)
  *H01L 21/52*   (2006.01)
  *C22C 9/04*    (2006.01)
  *B23K 35/02*   (2006.01)
  *B23K 1/008*   (2006.01)
  *H01R 4/02*    (2006.01)
  *H05K 13/04*   (2006.01)
  *B23K 35/30*   (2006.01)
  *B23K 35/22*   (2006.01)
  *H01L 23/00*   (2006.01)
  *H05K 3/34*    (2006.01)

(52) U.S. Cl.
  CPC ............... *C22C 13/00* (2013.01); *C22C 13/02* (2013.01); *H01L 21/52* (2013.01); *H01L 24/05* (2013.01); *H01L 24/29* (2013.01); *H01L 24/32* (2013.01); *H01L 24/83* (2013.01); *H01R 4/02* (2013.01); *H05K 13/0465* (2013.01); *B23K 2201/42* (2013.01); *H01L 24/27* (2013.01); *H01L 2224/04026* (2013.01); *H01L 2224/05647* (2013.01); *H01L 2224/2732* (2013.01); *H01L 2224/291* (2013.01); *H01L 2224/293* (2013.01); *H01L 2224/29111* (2013.01); *H01L 2224/29294* (2013.01); *H01L 2224/32227* (2013.01); *H01L 2224/32507* (2013.01); *H01L 2224/8381* (2013.01); *H01L 2224/8382* (2013.01); *H01L 2224/83101* (2013.01); *H01L 2224/83815* (2013.01); *H01L 2924/01322* (2013.01); *H05K 3/3436* (2013.01); *H05K 3/3463* (2013.01)

(56) References Cited

U.S. PATENT DOCUMENTS

| | | | | | |
|---|---|---|---|---|---|
| 5,003,373 | A | * | 3/1991 | Tsumura | B23K 20/007 228/110.1 |
| 5,557,083 | A | * | 9/1996 | Komuro | B22F 3/26 218/123 |
| 5,687,472 | A | * | 11/1997 | Honma | H01H 33/66 218/136 |
| 5,697,150 | A | * | 12/1997 | Komuro | C22C 1/045 164/94 |
| 5,779,825 | A | * | 7/1998 | Moon | B22F 3/08 148/513 |
| 5,852,266 | A | * | 12/1998 | Komuro | B22F 3/26 200/279 |
| 6,007,646 | A | * | 12/1999 | Moon | B23K 20/08 148/513 |
| 6,117,565 | A | * | 9/2000 | Wengler | B32B 15/01 384/912 |
| 6,160,715 | A | * | 12/2000 | Degani | H01L 23/13 257/723 |
| 6,175,158 | B1 | * | 1/2001 | Degani | H01L 23/49833 257/777 |
| 6,187,680 | B1 | * | 2/2001 | Costrini | H01L 24/03 257/E21.508 |
| 6,241,942 | B1 | * | 6/2001 | Murata | B23K 35/262 420/561 |
| 6,319,461 | B1 | * | 11/2001 | Domi | B23K 35/262 148/400 |
| 6,376,353 | B1 | * | 4/2002 | Zhou | H01L 21/32134 257/E21.309 |
| 6,395,994 | B1 | * | 5/2002 | Goenka | H01L 21/4846 174/255 |
| 6,474,537 | B1 | * | 11/2002 | Hasegawa | B23K 1/08 228/103 |
| 6,551,650 | B1 | * | 4/2003 | Carre | G02B 6/4232 228/180.1 |
| 6,660,226 | B1 | * | 12/2003 | Takaoka | B23K 35/262 148/400 |
| 6,678,167 | B1 | * | 1/2004 | Degani | H01L 23/36 257/E23.101 |
| 7,075,183 | B2 | | 7/2006 | Soga et al. | |
| 7,259,465 | B2 | | 8/2007 | Soga et al. | |
| 9,093,383 | B1 | * | 7/2015 | Chopin | H01L 23/295 |
| 2002/0121703 | A1 | * | 9/2002 | Toyoda | H01L 21/76834 257/762 |
| 2003/0025202 | A1 | * | 2/2003 | Mikagi | H01L 24/11 257/737 |
| 2004/0018660 | A1 | * | 1/2004 | Kim | C25D 7/123 438/108 |
| 2004/0157376 | A1 | * | 8/2004 | Weekamp | H01L 21/56 438/127 |
| 2004/0188851 | A1 | * | 9/2004 | Takewaki | H01L 21/76849 257/774 |
| 2004/0189147 | A1 | * | 9/2004 | Ito | H03H 9/02921 310/313 B |
| 2004/0259378 | A1 | * | 12/2004 | Chambers | H01L 21/76886 438/771 |
| 2006/0011709 | A1 | * | 1/2006 | Ojima | B23K 1/08 228/180.1 |
| 2006/0249844 | A1 | * | 11/2006 | Yang | H01L 21/563 257/737 |
| 2007/0092396 | A1 | * | 4/2007 | Huang | B23K 35/262 420/557 |
| 2007/0148950 | A1 | * | 6/2007 | Cheng | H01L 21/4853 438/612 |
| 2007/0148967 | A1 | * | 6/2007 | Kim | C25D 3/58 438/638 |
| 2009/0001492 | A1 | * | 1/2009 | Park | H01L 27/14621 257/432 |
| 2009/0200070 | A1 | * | 8/2009 | Kato | B22F 1/0074 174/257 |
| 2011/0039375 | A1 | * | 2/2011 | Nakagawa | H01L 23/49811 438/121 |
| 2011/0151322 | A1 | * | 6/2011 | Joo | H01M 4/134 429/209 |
| 2011/0233793 | A1 | * | 9/2011 | Miura | B23K 1/0016 257/779 |
| 2011/0291282 | A1 | | 12/2011 | Yamada et al. | |
| 2011/0303448 | A1 | * | 12/2011 | Anderson | B23K 35/001 174/259 |
| 2012/0125670 | A1 | * | 5/2012 | Kato | B22F 1/02 174/257 |
| 2012/0248616 | A1 | * | 10/2012 | Kitajima | H05K 3/284 257/772 |
| 2013/0134591 | A1 | * | 5/2013 | Sakamoto | B23K 35/025 257/746 |
| 2013/0175678 | A1 | * | 7/2013 | Ide | H01L 23/36 257/675 |
| 2014/0030140 | A1 | * | 1/2014 | Nishimura | B23K 35/262 420/560 |
| 2014/0061889 | A1 | * | 3/2014 | Noma | H01L 21/563 257/700 |
| 2014/0145339 | A1 | * | 5/2014 | Chopin | H01L 24/48 257/762 |
| 2014/0345939 | A1 | * | 11/2014 | Nakano | C22C 9/04 174/94 R |

FOREIGN PATENT DOCUMENTS

| | | | | |
|---|---|---|---|---|
| JP | 53121460 | A | * | 10/1978 |
| JP | 58071033 | A | * | 4/1983 |
| JP | 2002-254194 | A | | 9/2002 |
| JP | 2003-332731 | A | | 11/2003 |
| JP | 2010-179336 | A | | 8/2010 |
| WO | WO 2008034320 | A1 | * | 3/2008 ........... B23K 11/002 |

* cited by examiner

JOINING METHOD, METHOD FOR PRODUCING ELECTRONIC DEVICE AND ELECTRONIC PART

CROSS REFERENCE TO RELATED APPLICATIONS

The present application is a continuation of International application No. PCT/JP2013/053026, filed Feb. 8, 2013, which claims priority to Japanese Patent Application No. 2012-048025, filed Mar. 5, 2012, the entire contents of each of which are incorporated herein by reference.

FIELD OF THE INVENTION

The present invention relates to a joining method, a method for producing an electronic device, and an electronic part and more particularly to a joining method which is used in mounting, for example, an electronic part, a method for producing an electronic device, and an electronic part.

BACKGROUND OF THE INVENTION

When an electronic part is mounted, a joining method using solder (a solder paste) is widely used.

By the way, in the Sn—Pb solder previously widely used, a bonding method with temperature hierarchy is widely applied, in which soldering is performed at a temperature of 330° C. to 350° C. by using Pb-rich Pb-5Sn (melting point: 314° C. to 310° C.) or Pb-10Sn (melting point: 302° C. to 275° C.) as high temperature solder, for example, and then soldering is performed at a temperature equal to or lower than the melting point of the above-mentioned high temperature solder by using Sn-37Pb eutectic (melting point: 183° C.) of low temperature solder, for example, and thereby, connection by soldering is performed without melting the high temperature solder used in the previous soldering.

Such a bonding method with temperature hierarchy is applied to a semiconductor device of a type in which a chip is die-bonded or a semiconductor device which is subjected to flip-chip bonding, and it is an important technique used for the case where connection by soldering is performed in a semiconductor device, and then the semiconductor device itself is connected to a substrate by soldering.

As a solder paste used for this use, for example, a solder paste including a mixture of (a) second metal (or alloy) balls composed of a second metal such as Cu, Al, Au, or Ag or a high melting point alloy containing the second metal, and (b) first metal balls composed of Sn or In is proposed (refer to Patent Document 1).

Further, in Patent Document 1, a joining method using a solder paste and a method for producing an electronic equipment are disclosed.

Figures 2A, 2B:
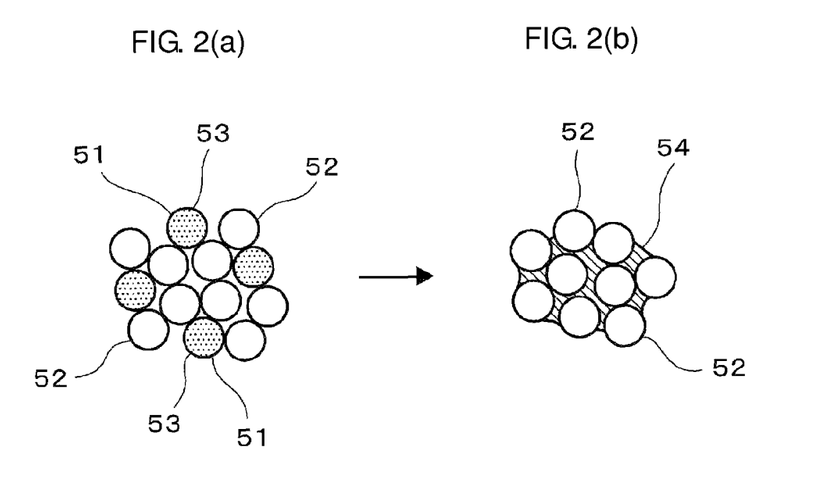
FIG. 2(a) is a drawing showing a state before heating and FIG. 2(b) is a drawing showing a state after completion of a soldering step.

When soldering is performed by using the solder paste described in Patent Document 1, as schematically shown in FIG. 2(a), the solder paste including low melting point metal (e.g., Sn) balls 51, high melting point metal (e.g., Cu) balls 52 and a flux 53 is heated to react, and after soldering, as shown in FIG. 2(b), a plurality of the high melting point metal balls 52 are connected to one another with an intermetallic compound 54 formed between a low melting point metal originating from the low melting point metal ball and a high melting point metal originating from the high melting point metal ball interposed therebetween, and by this connecting body, joining objects are connected (soldered) to each other.

In the case of the joining method using the solder paste described in Patent Document 1, the intermetallic compound between the high melting point metal (e.g., Cu) and the low melting point metal (e.g., Sn) is produced by heating the solder paste in the soldering step, and in the combination of Cu (high melting point metal) and Sn (low melting point metal), a large amount of Sn being a low melting point metal remains because the diffusion rates of these metals are slow. When Sn remains, the joint strength under elevated temperatures is significantly deteriorated, and there may be cases where the paste cannot be used depending on the type of the product to be joined. Further, there is a possibility that Sn remaining after the step of soldering may be melted and flowed out in the subsequent another soldering step, and there is a problem that this soldering is low in reliability as high temperature solder which is used for a bonding method with temperature hierarchy.

That is, for example, in a manufacturing process of a semiconductor device, when a semiconductor device is manufactured after undergoing a step of soldering, and then the semiconductor device is to be mounted on a substrate by a reflow soldering method, there is a possibility that Sn remaining after the step of soldering in the manufacturing process of a semiconductor device is melted and flowed out in the step of reflow soldering.

Further, it is necessary to heat the solder paste at a high temperature for a long time in the soldering step in order to convert the low melting point metal entirely to the intermetallic compound so that Sn may not remain, but this heating is practically impossible in consideration of the balance with productivity.

Figure 3:
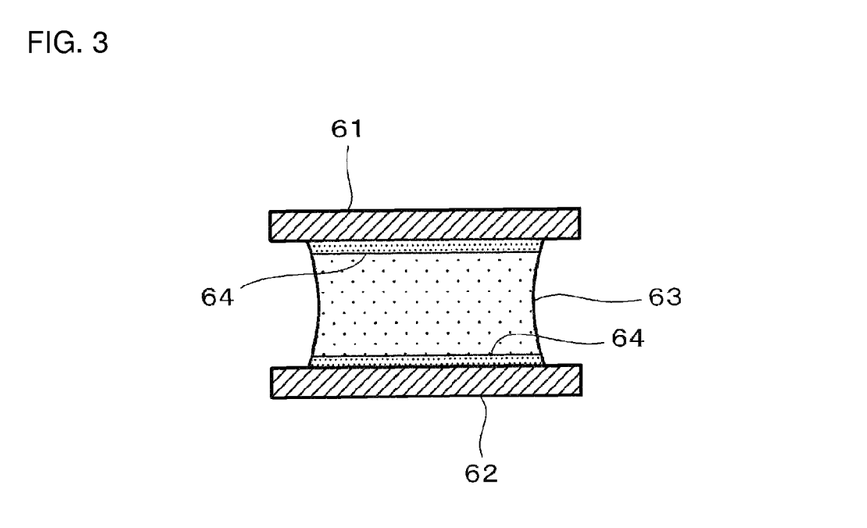
FIG. 3 is a drawing showing a joint structure in which a laminar intermetallic compound layer is formed at an interface in the case of joining using a conventional solder paste.

Moreover, when the solder paste described in Patent Document 1 is used, as shown in FIG. 3, an intermetallic compound 64 such as $Cu_3Sn$ or $Cu_6Sn_5$ is formed in a laminar form at an interface between joining objects 61, 62 after reflowing and a joining material (solder) 63. When such a laminar intermetallic compound 64 is formed, stress concentrates at the interface, and therefore the joint strength of the interface is deteriorated due to production of cracks or the like.

Patent Document 1: Japanese Patent Laid-open Publication No. 2002-254194

SUMMARY OF THE INVENTION

The present invention was made to solve the above-mentioned problems, and it is an object of the present invention to provide a joining method, a method for producing an electronic device and an electronic part in which a first metal member can be joined to a second metal member while securing sufficient joint strength, and flow out of a joining material at a second reflow stage in bonding with temperature hierarchy can be suppressed/prevented.

In order to solve the above-mentioned problems, a joining method of the present invention is:

a joining method for joining a first metal member having a first metal to a second metal member having a second metal by using a joining material predominantly composed of a low melting point metal having a lower melting point than the first metal and/or the second metal, wherein the low melting point metal composing the joining material is Sn or an alloy containing Sn, at least one of the first metal and the second metal is predominantly composed of a Cu—Al alloy and/or a Cu—Cr alloy, and the joining method includes a heat treatment step of heat-treating the first metal member and the second metal member with the joining material located therebetween at a temperature at which the low melting point metal composing the joining material melts to join the first metal member to the second metal member with a joint portion, which includes an intermetallic compound produced by the reaction of the low melting point metal composing the joining material with the Cu—Al alloy or the Cu—Cr alloy composing the first metal and/or the second metal, interposed between the first metal member and the second metal member.

Further, in the joining method of the present invention, it is generally preferred that the Cu—Al alloy contains Al in a proportion of 5 to 30% by weight and the Cu—Cr alloy contains Cr in a proportion of 5 to 30% by weight.

Further, a method for joining an electronic device of the present invention is a method for producing an electronic device including a first metal member having a first metal and a second metal member having a second metal and having a structure in which the first metal member is joined to the second metal member, wherein the production method includes a step of joining the first metal member to the second metal member by the above-mentioned joining method of the present invention.

Further, an electronic part of the present invention is an electronic part including an electrode to be subjected to joining by a joining material including a low melting point metal composed of Sn or an alloy containing Sn, wherein the electrode in contact with the joining material has a Cu—Al alloy and/or a Cu—Cr alloy.

In the joining method of the present invention, since, in joining a first metal member having a first metal to a second metal member having a second metal with a joining material interposed therebetween, the joining material including a low melting point metal having a lower melting point than at least one of the first metal and the second metal, the low melting point metal composing the joining material is Sn or an alloy containing Sn, at least one of the first metal and the second metal is predominantly composed of a Cu—Al alloy and/or a Cu—Cr alloy, and heat treatment is performed at a temperature at which the low melting point metal composing the joining material melts in a state of locating the joining material between the first metal member and the second metal member, it is possible to produce a joint portion including an intermetallic compound produced by the reaction of the low melting point metal (Sn or an alloy containing Sn) composing the joining material with the Cu—Al alloy or the Cu—Cr alloy composing the first metal and/or the second metal, and to securely join the first metal member to the second metal member with the joint portion interposed therebetween. Consequently, it becomes possible to obtain a highly reliable joint structure which is excellent in heat resistance and thermal shock resistance.

That is, in accordance with the joining method of the present invention, an intermetallic compound is produced by the reaction of the low melting point metal with the first metal and/or the second metal in a step of heat-treating the joining material located between the first metal member and the second metal member, and consequently the interdiffusion between the first metal and/or the second metal and the low melting point metal outstandingly proceeds to promote the conversion to an intermetallic compound having a higher melting point. Accordingly, it becomes possible to perform joining having high strength in high temperature, and adequate joint strength and impact resistance.

In addition, since both Al and Cr composing the first metal and/or the second metal (Cu alloy) have smaller first ionization energy than Cu and these metals (Al and Cr) are solid-solved in Cu, Al and Cr are oxidized prior to Cu. As a result, diffusion of Cu which is not oxidized into the melted low melting point metal (Sn or an alloy containing Sn) is promoted, and the first metal and/or the second metal forms an intermetallic compound with the low melting point metal in an extremely short time. Accordingly, the content of the low melting point metal in the joint portion is decreased by the amount of the intermetallic compound formed, and thereby, the melting point of the joint portion is raised to improve the strength in high temperature.

That is, when the first metal member is joined to the second metal member by using the joining material, the heat treatment is performed in a state in which the joining material is positioned between the first metal member and the second metal member. In this case, when the temperature reaches the melting point of the low melting point metal (Sn or an alloy containing Sn) composing the joining material or higher, the low melting point metal is melted. Then, the first metal and/or the second metal and the melted low melting point metal are rapidly diffused to produce an intermetallic compound.

When the heating is further continued thereafter, the low melting point metal further reacts with the first metal and/or the second metal, and when the compositional ratio of the low melting point metal to the first metal and/or the second metal is in a preferred condition, substantially all of the low melting point metal turns into an intermetallic compound, so that a joint structure having excellent heat resistance of a joint portion can be obtained.

Further, it is preferred from the viewpoint of rapidly reacting the low melting point metal (Sn or an alloy containing Sn) composing the joining material with the first metal and/or the second metal to form an intermetallic compound that the surface of the first metal member and/or the second metal member is composed of a metal containing a Cu—Al alloy and/or a Cu—Cr alloy as a main component.

In accordance with the joining method of the present invention, it is possible to perform joining having such high joint reliability at a high temperature that remelting of a joint portion is prevented and falling off of an electronic part does not occur even when reflow is carried out multiple times after the electronic part is mounted by soldering or when the mounted electronic part (for example, car-mounted electronic part) is used in a high-temperature environment, for example, in the case where the first metal member is an external electrode of the electronic part and the second metal member is an electrode for mounting of a substrate.

Further, in the joining method of the present invention, joining between the first metal member and the second metal member is performed by heat-treating the first metal member and the second metal member with the joining material located therebetween at a temperature at which the low melting point metal composing the joining material melts, and specific aspects in which such joining (heat-treatment) is performed include, for example, An aspect in which the first metal and the second metal are metal materials themselves composing the first metal member and the second metal member to be joined to each other, respectively, at least one of the first metal and the second metal is a Cu—Al alloy and/or a Cu—Cr alloy, and the low melting point metal is supplied between the first metal member and the second metal member as a constituent material of a solder paste or plate-like solder, and An aspect in which the first metal and the second metal are metal materials composing plating films formed on the surfaces of the first metal member (electrode body) and the second metal member (electrode body) to be joined to each other, respectively, at least one of the first metal and the second metal is a Cu—Al alloy and/or a Cu—Cr alloy, and the low melting point metal is supplied between the surfaces of the first metal member and the second metal member respectively provided with the plating films as a constituent material of a solder paste or plate-like solder.

Further, in the joining method of the present invention, when the heat treatment step is performed in a state in which the ratio of the amount of (b) the Cu—Al alloy and the Cu—Cr alloy of the first metal and the second metal to the total amount of (a) the low melting point metal composing the joining material and (b) (i.e., the total amount of (a) and (b)) is 30% by volume or more, since the diffusion of the first metal and the second metal (Cu—Al alloy, Cu—Cr alloy) into the low melting point material composing the joining material adequately proceeds to promote the conversion to an intermetallic compound having a higher melting point and the low melting point metal component remains little, it becomes possible to perform joining having higher strength in high temperature.

Further, "a state in which the ratio of the amount of (b) the Cu—Al alloy and the Cu—Cr alloy of the first metal and the second metal . . . is 30% by volume or more" refers to a state represented by the following formula (1).

[(first metal+second metal)/{low melting point metal+ (first metal+second metal)}]×100≥30(% by volume)   (1)

Further, a method for producing an electronic device of the present invention can efficiently produce a highly reliable electronic device in which the first metal member is securely joined to the second metal member with the joining material interposed therebetween since, in producing the electronic device including the first metal member composed of a first metal and the second metal member composed of a second metal, the first metal member is joined to the second metal member by the above-mentioned joining method of the present invention.

Further, the electronic part of the present invention is suitable for being subjected to the joining method of the present invention since, in the electronic part including an electrode to be subjected to joining by a joining material including a low melting point metal composed of Sn or an alloy containing Sn, the electrode has a Cu—Al alloy or a Cu—Cr alloy, and the electronic part of the present invention can provide an electronic part capable of efficiently performing highly reliable mounting.

That is, for example, by placing the electronic part of the present invention in such a manner that the electrodes thereof are opposed to electrodes for mounting with a solder paste on the substrate, and reflowing the electronic part, it is possible to securely join the electrode of the electronic part to the electrode for mounting of the substrate with the joint portion interposed therebetween, is the joint portion being predominantly composed of an intermetallic compound produced by the reaction of the low melting point metal contained in the joining material with an Al alloy or a Cu—Cr alloy to perform highly reliable mounting.

BRIEF EXPLANATION OF THE DRAWINGS

FIGS. 1(a) to 1(c) are drawings schematically showing the behavior in joining by a joining method of an example of the present invention.

FIGS. 2(a) and 2(b) are drawings showing a behavior of solder in the case of soldering using a conventional solder paste, where

DETAILED DESCRIPTION OF THE INVENTION

Embodiments of the present invention will be shown below, and characteristics of the present invention will be described in more detail.

Embodiment 1

Figure 1A:
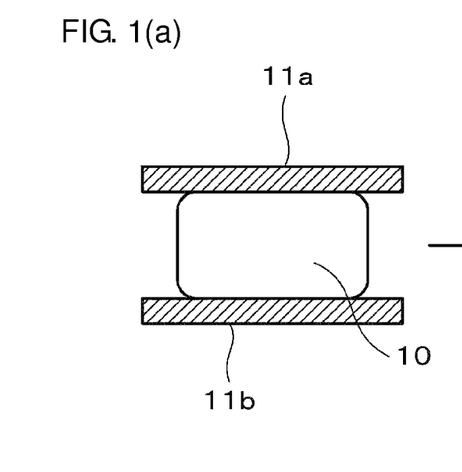
FIG. 1(a) is a drawing showing a state before heating.
Figure 1B:
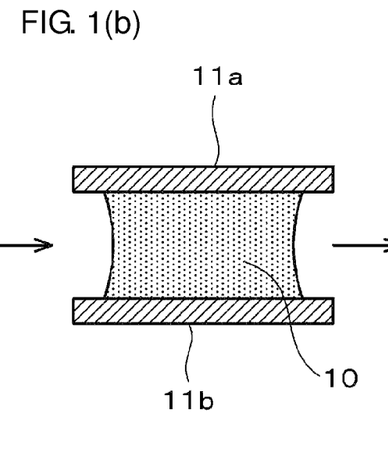
FIG. 1(b) is a drawing showing a state in which heating is initiated and a joining material is melted.
Figure 1C:
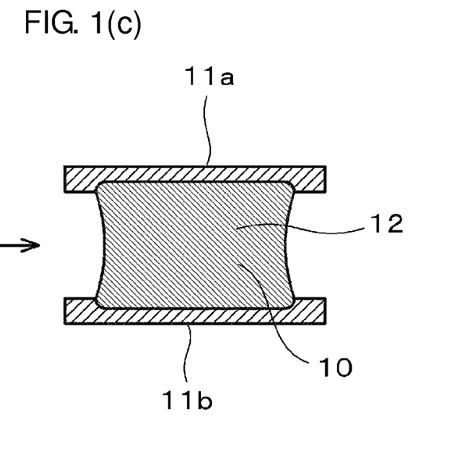
FIG. 1(c) is a drawing showing a state in which heating is continued and an intermetallic compound between a low melting point metal composing the joining material and at least one of a first metal member and a second metal member is formed.

In the present Embodiment 1, as shown in FIG. 1(a) to FIG. 1(c), a first metal member 11a composed of a first metal was joined to a second metal member 11b composed of a second metal by using a joining material 10 predominantly composed of a low melting point metal having a lower melting point than the first metal and the second metal.

In the present Embodiment 1, as the low melting point metal composing the joining material, as shown in the sample Nos. 1 to 13 in Table 1, Sn-3Ag-0.5Cu, Sn, Sn-3.5Ag, Sn-0.75Cu, Sn-0.7Cu-0.05Ni, Sn-5Sb, Sn-2Ag-0.5Cu-2Bi, Sn-3.5Ag-0.5Bi-8In, Sn-9Zn, or Sn-8Zn-3Bi was used.

In addition, in the above-mentioned expressions of the low melting point metal composing the joining material, for example, "Sn-3Ag-0.5Cu" indicates that the low melting point metal material is an alloy (Sn alloy) containing Ag in an amount of 3% by weight, Cu in an amount of 0.5% by weight, and Sn as the rest of the material.

As the first metal member and the second metal member, as shown in the sample Nos. 1 to 10 in Table 1, metal members composed of Cu-10Al were used.

Further, for comparison, as shown in the sample Nos. 11 to 13 in Table 1, as the first metal member and the second metal member, metal members composed of Cu (sample No. 11), Cu-10Zn (sample No. 12), or Cu-10Ge (sample No. 13) were prepared.

In addition, in the present Embodiment 1, in joining the first metal member to the second metal member described above with a joining material predominantly composed of the low melting point metal, a joining material shaped into a plate was located between the first metal member and the second metal member and reflowed at 250° C. for 30 minutes under a load to join the first metal member to the second metal member.

Here, in reference to FIG. 1(a) to FIG. 1(c), a joining method in the present Embodiment 1 will be described below.

First, as shown in FIG. 1(a), the joining material 10 shaped into a plate is positioned between the first metal member 11a and the second metal member 11b.

Next, in this state, the joining material is reflowed at 250° C. for 15 minutes under a load to melt the low melting point metal (Sn or a Sn alloy) composing the joining material 10, as shown in FIG. 1(b). Then, by further keeping on heating for a predetermine time (15 minutes) (that is, by reflowing at 250° C. for 30 minutes), the low melting point metal composing the joining material 10 is melted and reacted with the first metal and/or the second metal respectively composing the first metal member 11a and the second metal member 11b to produce an intermetallic compound 12 (FIG. 1(c)).

Thereby, a joined body in which the first metal member is joined to the second metal member by the joining material containing an intermetallic compound solidified after the reflow is obtained.

In addition, it was confirmed that in accordance with the joining method of the present invention, a Cu—Al—Sn intermetallic compound exists in a state of being dispersed in the joining material.

[Evaluation of Characteristics]

The joint structures thus obtained were used as samples, and their characteristics were evaluated by the following methods.

<<Joint Strength>>

The shear strength of each of the obtained joint structures was measured by using a bonding tester, and the joint strength was evaluated.

Measurement of the shear strength was carried out under conditions of a lateral push rate: 0.1 mm·s$^{-1}$ and room temperature and 260° C.

The sample having a shear strength of 20 Nmm$^{-2}$ or more was rated as "⊙" (excellent), and the sample having a shear strength of 2 Nmm$^{-2}$ or less was rated as "X" (defective).

The measured joint strength values (at room temperature and 260° C.) of the samples and the evaluation results are shown together in Table 1.

<<Evaluation of Remaining Component>>

About 7 mg of a joining material (reaction product) containing an intermetallic compound solidified after the reflow was cut out, and subjected to differential scanning calorimetry (DSC) using $Al_2O_3$ as a reference under conditions of a measurement temperature of 30° C. to 300° C. and a temperature rise rate of 5° C./rain in a nitrogen atmosphere. The amount of the remaining low melting point metal component was quantified from an endothermic quantity of a melting endothermic peak at a melting temperature of the low melting point metal component in the resulting DSC chart and the content (% by volume) of the remaining low melting point metal was determined. Then, the case where the content of the remaining low melting point metal was 0 to 50% by volume was rated as "⊙" (excellent), and the case where the content was more than 50% by volume was rated as "X" (defective).

The contents of the remaining low melting point metal and evaluation results are shown together in Table 1.

<<Flow Out Percent Defective (%)>>

The obtained joined bodies were sealed with an epoxy resin, left standing in an environment of 85% in relative humidity, and heated in the reflow condition of a peak temperature of 260° C. to determine the incidence rate of flow out defects in which the joining material was remelted and flowed out. The flow out percent defective was determined from this result and evaluated.

The case where the flow out percent defective of the joining material was 0 to 50% was rated as "⊙" (excellent), and the case where the flow out percent defective was more than 50% was rated as "X" (defective).

The flow out percent defectives and evaluation results are shown together in Table 1.

<<Presence or Absence of Cracks and Joint Strength After Thermal Shock Test>>

The obtained joined bodies (samples) were subjected to a test in which a cycle of holding the sample respectively for 30 minutes under the temperature conditions of −40° C. and +85° C. is repeated a thousand times, and then the production of cracks of each sample was observed. Then, the presence or absence of production of cracks was evaluated.

Further, the joint strength of the samples after the thermal shock test was evaluated in the same way as in the above-mentioned test. The sample having a shear strength of 20 Nmm$^{-2}$ or more was rated as "⊙" (excellent), and the sample having a shear strength of 10 Nmm$^{-2}$ or less was rated as "X" (defective).

The presence or absence of cracks and joint strength after the thermal shock test are shown together in Table 1. In addition, the production of cracks was evaluated not because the crack itself is problematic but because it is a factor for deteriorating the joint strength.

TABLE 1

| Sample No. | Composition of Low Melting Point Metal Composing Joining Material | Composition of First Metal and Second Metal | Evaluation of Joint Strength (Room Temperature) | | Evaluation of Joint Strength (260° C.) | | Content of Remaining Low Melting Point Metal and Evaluation | |
|---|---|---|---|---|---|---|---|---|
| | | | Joint Strength (Nmm$^{-2}$) | Rating | Joint Strength (Nmm$^{-2}$) | Rating | Content (%) | Rating |
| 1 | Sn—3Ag—0.5Cu | Cu—10Al | 27 | ⊙ | 25 | ⊙ | 27 | ⊙ |
| 2 | Sn | Cu—10Al | 26 | ⊙ | 25 | ⊙ | 29 | ⊙ |
| 3 | Sn—3.5Ag | Cu—10Al | 29 | ⊙ | 28 | ⊙ | 28 | ⊙ |
| 4 | Sn—0.75Cu | Cu—10Al | 28 | ⊙ | 26 | ⊙ | 27 | ⊙ |
| 5 | Sn—0.7Cu—0.05Ni | Cu—10Al | 28 | ⊙ | 27 | ⊙ | 29 | ⊙ |
| 6 | Sn—5Sb | Cu—10Al | 30 | ⊙ | 27 | ⊙ | 30 | ⊙ |
| 7 | Sn—2Ag—0.5Cu—2Bi | Cu—10Al | 27 | ⊙ | 27 | ⊙ | 30 | ⊙ |
| 8 | Sn—3.5Ag—0.5Bi—8In | Cu—10Al | 26 | ⊙ | 25 | ⊙ | 31 | ⊙ |
| 9 | Sn—9Zn | Cu—10Al | 25 | ⊙ | 24 | ⊙ | 35 | ⊙ |
| 10 | Sn—8Zn—3Bi | Cu—10Al | 25 | ⊙ | 23 | ⊙ | 33 | ⊙ |
| 11* | Sn—3Ag—0.5Cu | Cu | 26 | ⊙ | 0.3 | X | 75 | X |
| 12* | Sn—3Ag—0.5Cu | Cu—10Zn | 30 | ⊙ | 1.8 | X | 77 | X |
| 13* | Sn—3Ag—0.5Cu | Cu—10Ge | 25 | ⊙ | 0.7 | X | 76 | X |

| Sample No. | Evaluation of Flow Out | | Thermal Shock Test and Evaluation | | |
|---|---|---|---|---|---|
| | Flow Out Percent Defective (%) | Rating | Presence or Absence of Crack Production | Joint Strength (Nmm$^{-2}$) | Evaluation |
| 1 | 10 | ⊙ | absent | 26 | ⊙ |
| 2 | 10 | ⊙ | absent | 26 | ⊙ |

TABLE 1-continued

| | | | | | |
|---|---|---|---|---|---|
| 3 | 11 | ⊙ | absent | 28 | ⊙ |
| 4 | 12 | ⊙ | absent | 27 | ⊙ |
| 5 | 15 | ⊙ | absent | 25 | ⊙ |
| 6 | 15 | ⊙ | absent | 26 | ⊙ |
| 7 | 16 | ⊙ | absent | 25 | ⊙ |
| 8 | 15 | ⊙ | absent | 24 | ⊙ |
| 9 | 22 | ⊙ | absent | 23 | ⊙ |
| 10 | 14 | ⊙ | absent | 24 | ⊙ |
| 11* | 70 | X | present | 8 | X |
| 12* | 75 | X | present | 5 | X |
| 13* | 73 | X | present | 7 | X |

In addition, in Table 1, samples with the sample No. marked with * (samples of the sample Nos. 11 to 13) are samples for comparison not satisfying the requirements of the present invention (comparative examples).

As shown in Table 1, it was verified with respect to the joint strength at room temperature that both of the samples of examples of sample Nos. 1 to 10 complying with the requirements of the present invention and the samples of comparative examples of sample Nos. 11 to 13 not complying with the requirements of the present invention exhibit a joint strength of 20 Nmm$^{-2}$ or more and have practical strength.

On the other hand, with respect to the joint strength at 260° C., it was verified that while the samples of comparative examples of sample Nos. 11 to 13 exhibited an insufficient joint strength of 2 Nmm$^{-2}$ or less, the samples of examples of sample Nos. 1 to 10 exhibited a joint strength of 20 Nmm$^{-2}$ or more (23 to 28 Nmm$^{-2}$) and have practical strength.

Further, with respect to the content of the remaining low melting point metal (evaluation of a remaining component), it was found that in the samples of comparative examples of sample Nos. 11 to 13, the content of the remaining low melting point metal was larger than 50% by volume, and on the other hand, in all of the samples of examples of sample Nos. 1 to 10, the content of the remaining low melting point metal was 50% by volume or less (27 to 35% by volume).

Further, with respect to the flow out percent defective of the joining material, it was verified that in the samples of comparative examples of sample Nos. 11 to 13, the flow out percent defective was larger than 50%, and on the other hand, in all of the samples of examples of sample Nos. 1 to 10, the flow out percent defective was 50% or less (10 to 22%).

It was verified that the samples of examples of sample Nos. 1 to 10 have similar high heat resistance irrespective of the type of the low melting point metal.

Further, in the samples of comparative examples of sample Nos. 11 to 13, production of cracks was found after completion of the 1000 cycle test in the observation of the sample after the thermal shock test. The cracks were produced principally within a Cu$_3$Sn layer and a Cu$_6$Sn$_5$ layer (intermetallic compound layers) formed at an interface between the joining material and the first metal member and/or the second metal member, at an interface between the intermetallic compound layer and the first metal member and/or the second metal member, and at an interface between the intermetallic compound layer and the joining material.

On the other hand, in the samples of examples of sample Nos. 1 to 10, the above-mentioned production of cracks was not found.

With respect to the thermal shock resistance, in the samples of comparative examples of sample Nos. 11 to 13, the joint strength after the thermal shock test was as low as 5 to 8 Nmm$^{-2}$, but in the samples of sample Nos. 1 to 10 which satisfy the requirements of the present invention, it was verified that the joint strength after the thermal shock test was 20 Nmm$^{-2}$ or more (23 to 28 Nmm$^{-2}$), and the joint strength was largely improved compared with the samples in comparative examples.

In addition, it was verified that in the samples of sample Nos. 1 to 10 complying with the requirements of the present invention, a laminar intermetallic compound of Cu$_3$Sn or Cu$_6$Sn$_5$ was not formed at an interface between the first metal member and the second metal member respectively composed of a Cu—Al alloy in the joint portion.

The reason why the joint strength after the thermal shock test is high in the case of the samples of examples of sample Nos. 1 to 10 complying with the requirements of the present invention is probably that the proportion of the low melting point metal (Sn or a Sn alloy) remaining in the joint portion was low, growth of an intermetallic compound layer or production of cracks in performing the thermal shock test was suppressed in a joint body obtained after reflow, and deterioration of the joint strength was not caused.

The reason why the samples of sample Nos. 1 to 10 satisfying the requirements of the present invention have high heat resistance is likely that the Cu—Al alloy is used as the first metal member and the second metal member, and the first ionization energy of Al solid-solved is as small as 578 kJ·mol$^{-1}$ relative to Cu having a first ionization energy of 746 kJ·mol$^{-1}$. That is, since Al having a small first ionization energy is solid-solved in Cu, ionization of Al or oxidation of Al suppresses oxidation of Cu which is diffusion-driven to promote a reaction.

On the other hand, in the case of using the Cu—Zn alloy as the second metal as with the comparative example, it is thought that since the first ionization energy of Zn is 906 kJ·mol$^{-1}$ and larger than that of Cu, the oxidation of Cu which is diffusion-driven becomes marked, the formation reaction of an intermetallic compound does not efficiently proceed, and therefore the heat resistance cannot be improved.

Embodiment 2

The first metal member composed of the first metal was joined to the second metal member composed of the second metal by using a joining material predominantly composed of a low melting point metal (Sn or an alloy containing Sn) having a lower melting point than the first metal and the second metal in the same manner and condition as in Embodiment 1 described above except that a member composed of a Cu-10Cr alloy shown in sample Nos. 14 to 23 in Table 2 was used as the first metal member and the second metal member.

Then, their characteristics were measured by the same method as in Embodiment 1 described above and evaluated according to the same criteria.

The composition and the results of characteristics evaluation of the low melting point metal, the first metal and the second metal are shown together in Table 2. In addition, the composition and the results of characteristics evaluation of the same samples (samples of sample Nos. 11 to 13) as the sample of comparative example prepared in Embodiment 1 are shown together in Table 2.

TABLE 2

| Sample No. | Composition of Low Melting Point Metal Composing Joining Material | Composition of First Metal and Second Metal | Evaluation of Joint Strength (Room Temperature) Joint Strength (Nmm$^{-2}$) | Rating | Evaluation of Joint Strength (260° C.) Joint Strength (Nmm$^{-2}$) | Rating | Content of Remaining Low Melting Point Metal and Evaluation Content (%) | Rating |
|---|---|---|---|---|---|---|---|---|
| 14 | Sn—3Ag—0.5Cu | Cu—10Cr | 24 | ⊙ | 23 | ⊙ | 44 | ⊙ |
| 15 | Sn | Cu—10Cr | 25 | ⊙ | 25 | ⊙ | 49 | ⊙ |
| 16 | Sn—3.5Ag | Cu—10Cr | 27 | ⊙ | 26 | ⊙ | 48 | ⊙ |
| 17 | Sn—0.75Cu | Cu—10Cr | 28 | ⊙ | 27 | ⊙ | 45 | ⊙ |
| 18 | Sn—0.7Cu—0.05Ni | Cu—10Cr | 26 | ⊙ | 25 | ⊙ | 45 | ⊙ |
| 19 | Sn—5Sb | Cu—10Cr | 30 | ⊙ | 30 | ⊙ | 46 | ⊙ |
| 20 | Sn—2Ag—0.5Cu—2Bi | Cu—10Cr | 28 | ⊙ | 27 | ⊙ | 47 | ⊙ |
| 21 | Sn—3.5Ag—0.5Bi—8In | Cu—10Cr | 27 | ⊙ | 27 | ⊙ | 47 | ⊙ |
| 22 | Sn—9Zn | Cu—10Cr | 29 | ⊙ | 28 | ⊙ | 44 | ⊙ |
| 23 | Sn—8Zn—3Bi | Cu—10Cr | 27 | ⊙ | 25 | ⊙ | 45 | ⊙ |
| 11* | Sn—3Ag—0.5Cu | Cu | 26 | ⊙ | 0.3 | X | 75 | X |
| 12* | Sn—3Ag—0.5Cu | Cu—10Zn | 30 | ⊙ | 1.8 | X | 77 | X |
| 13* | Sn—3Ag—0.5Cu | Cu—10Ge | 25 | ⊙ | 0.7 | X | 76 | X |

| Sample No. | Evaluation of Flow Out Flow Out Percent Defective (%) | Rating | Thermal Shock Test and Evaluation Presence or Absence of Crack Production | Joint Strength (Nmm$^{-2}$) | Evaluation |
|---|---|---|---|---|---|
| 14 | 33 | ⊙ | absent | 24 | ⊙ |
| 15 | 36 | ⊙ | absent | 24 | ⊙ |
| 16 | 35 | ⊙ | absent | 25 | ⊙ |
| 17 | 33 | ⊙ | absent | 27 | ⊙ |
| 18 | 32 | ⊙ | absent | 25 | ⊙ |
| 19 | 33 | ⊙ | absent | 28 | ⊙ |
| 20 | 35 | ⊙ | absent | 27 | ⊙ |
| 21 | 34 | ⊙ | absent | 25 | ⊙ |
| 22 | 32 | ⊙ | absent | 27 | ⊙ |
| 23 | 33 | ⊙ | absent | 27 | ⊙ |
| 11* | 70 | X | present | 8 | X |
| 12* | 75 | X | present | 5 | X |
| 13* | 73 | X | present | 7 | X |

As shown in Table 2, it was verified with respect to the joint strength at room temperature that both of the samples of examples of sample Nos. 14 to 23 complying with the requirements of the present invention and the samples of comparative examples of sample Nos. 11 to 13 not complying with the requirements of the present invention (the same samples as the samples of comparative examples prepared in Embodiment 1) exhibit a joint strength of 20 Nmm$^{-2}$ or more and have practical strength.

On the other hand, with respect to the joint strength at 260° C., it was verified that while the samples of comparative examples of sample Nos. 11 to 13 exhibited an insufficient joint strength of 2 Nmm$^{-2}$ or less, the samples of examples of sample Nos. 14 to 23 held a joint strength of 20 Nmm$^{-2}$ or more (23 to 30 Nmm$^{-2}$) and have practical strength.

Further, with respect to the content of the remaining low melting point metal (evaluation of a remaining component), it was found that in the samples of comparative examples of sample Nos. 11 to 13, the content of the remaining low melting point metal was larger than 50% by volume, and on the other hand, in all of the samples of examples of sample Nos. 14 to 23, the content of the remaining low melting point metal was 50% by volume or less (44 to 49% by volume).

Further, with respect to the flow out percent defective of the joining material, it was verified that in the samples of comparative examples of sample Nos. 11 to 13, the flow out percent defective was larger than 50%, and on the other hand, in all of the samples of examples of sample Nos. 14 to 23, the flow out percent defective was 50% or less (32 to 36%).

It was verified that the samples of examples of sample Nos. 14 to 23 have similar high heat resistance irrespective of the type of the low melting point metal.

Further, in the samples of examples of sample Nos. 14 to 23, production of cracks was not found in the observation of the sample after the thermal shock test.

With respect to the thermal shock resistance, in the samples of comparative examples of sample Nos. 11 to 13, the joint strength after the thermal shock test was as low as 5 to 8 Nmm$^{-2}$, but in the samples of sample Nos. 14 to 23 which satisfy the requirements of the present invention, it was verified that the joint strength after the thermal shock test was 20 Nmm$^{-22}$ or more (24 to 28 Nmm$^{-22}$), and the joint strength was largely improved compared with samples in comparative examples.

In addition, it was verified that in the samples of sample Nos. 14 to 23 complying with the requirements of the present invention, no laminar intermetallic compound of Cu$_3$Sn or Cu$_6$Sn$_5$ was formed at an interface between the first metal member and the second metal member, respectively composed of a Cu—Cr alloy in the joint portion.

The reason why the joint strength after the thermal shock test is high in the case of the samples of examples of sample Nos. 14 to 23 complying with the requirements of the present invention is probably that the proportion of the low melting point metal (Sn or a Sn alloy) remaining in the joint portion is low, growth of an intermetallic compound layer or production of cracks in performing the thermal shock test is suppressed in a joint body obtained after reflow, and deterioration of the joint strength was not caused.

The reason why the samples of sample Nos. 14 to 23 satisfying the requirements of the present invention have high heat resistance is likely that in the case of the example using the Cu—Cr alloy as the first metal member and the second metal member, the first ionization energy of Cr solid-solved is as small as 653 kJ·mol$^{-1}$ relative to Cu having a first ionization energy of 746 kJ·mol$^{-1}$. That is, since Cr having a small first ionization energy is solid-solved in Cu, ionization of Cr or oxidation of Cr suppresses oxidation of Cu which is diffusion-driven to promote a reaction.

On the other hand, in the case of using the Cu—Zn alloy as the second metal as with the comparative example, it is thought that since the first ionization energy of Zn is 906 kJ·mol$^{-1}$ and larger than that of Cu, the oxidation of Cu which is diffusion-driven becomes marked, and the formation reaction of an intermetallic compound does not efficiently proceed.

The case in which both of the first metal member and the second metal member are Cu—Al alloys, or both are Cu—Cr alloys has been described as an example, but in the present invention, either the first metal member or the second metal member may be a Cu—Al alloy or a Cu—Cr alloy. Also in this case, the first metal member can be securely joined to the second metal member since a joint portion predominantly composed of an intermetallic compound is formed.

Further, in Embodiments 1 and 2 described above, the first metal member composed of a Cu—Al alloy or a Cu—Cr alloy was joined to the second metal member composed of a Cu—Al alloy or a Cu—Cr alloy by using the joining material containing the low melting point metal (Sn or an alloy containing Sn), but also when an electrode for mounting (first metal member in the present invention) composed of, for example, a Cu—Al alloy or a Cu—Cr alloy, or provided with a plating film thereof on a glass epoxy substrate is joined to an external electrode (second metal member in the present invention) composed of a Cu—Al alloy or a Cu—Cr alloy, or provided with a plating film thereof, of a chip capacitor (electronic part) by using a solder paste formed by mixing a low melting point metal (Sn or an alloy containing Sn) and a flux, it was verified as with Embodiments 1 and 2 described above that the first metal member can be securely joined to the second metal member with sufficient joint strength, and that flow out of a joining material at a second reflow stage in bonding with temperature hierarchy can be prevented.

The present invention is not intended to be limited to the above-mentioned embodiments in other points, and various applications and variations may be made on the type of the joining object, the condition in the joining step, the specific composition of the low melting point metal composing the joining material, the composition of the first metal and the second metal and the like within the scope of the invention.

DESCRIPTION OF REFERENCE SYMBOLS

10 Plate-like joining material
11a First metal member (first metal)
11b Second metal member (second metal)
12 Intermetallic compound

The invention claimed is:

1. A joining method for joining a first metal member having a first metal to a second metal member having a second metal by using a joining material predominantly composed of a low melting point metal having a lower melting point than the first metal and/or the second metal, wherein
    the low melting point metal composing the joining material is Sn or an alloy containing Sn,
    at least one of the first metal and the second metal is predominantly composed of a Cu—Al alloy that contains 5 to 30% by weight of Al, and
    the joining method comprises heat-treating the first metal member and the second metal member with the joining material located therebetween at a temperature at which the low melting point metal melts to join the first metal member to the second metal member with a joint portion interposed between the first metal member and the second metal member, the joint portion including an intermetallic compound produced by a reaction of the low melting point metal with the Cu—Al alloy of the first metal and/or the second metal.

2. The joining method according to claim 1, wherein the heat-treating includes reflowing the joining material at 250° C. for 30 minutes under a load.

3. The joining method according to claim 1, wherein the heat-treating includes a first heating of reflowing the joining material at 250° C. for 15 minutes under a load to melt the low melting point metal, and a second heating at 250° C. for 15 minutes such that the low melting point metal composing the joining material is melted and reacted with the first metal and/or the second metal to produce the intermetallic compound.

4. A method for producing an electronic device, the method comprising joining the first metal member to the second metal member by the joining method according to claim 1.

5. An electronic part comprising:
    an electrode joined to a joining material including a low melting point metal composed of Sn or an alloy containing Sn, wherein the electrode joined to the joining material includes a Cu—Al alloy that contains 5 to 30% by weight of Al.

* * * * *